(12) United States Patent
Fetter et al.

(10) Patent No.: US 6,306,313 B1
(45) Date of Patent: Oct. 23, 2001

(54) SELECTIVE ETCHING OF THIN FILMS

(75) Inventors: Linus Albert Fetter, Morganville; John Z. Pastalan, Hampton, both of NJ (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/497,982

(22) Filed: Feb. 4, 2000

(51) Int. Cl.[7] .............................. B44C 1/22; H01L 21/00
(52) U.S. Cl. .......................... 216/67; 216/77; 438/734
(58) Field of Search ..................... 216/67, 77; 438/734; 252/79.1

(56) References Cited

U.S. PATENT DOCUMENTS

| | | | |
|---|---|---|---|
| 2,303,457 | 12/1942 | Harding et al. | 172/239 |
| 4,502,932 | 3/1985 | Kline et al. | 204/192 EC |
| 4,556,812 | 12/1985 | Kline et al. | 310/324 |
| 4,719,383 | 1/1988 | Wang et al. | 310/324 |
| 4,890,370 | 1/1990 | Fukuda et al. | 29/25.35 |
| 4,988,957 | 1/1991 | Thompson et al. | 331/107 A |
| 5,075,641 | 12/1991 | Weber et al. | 331/108 C |
| 5,166,646 | 11/1992 | Avanic et al. | 331/107 A |
| 5,185,589 | 2/1993 | Krishnaswamy et al. | 333/133 |
| 5,231,327 | 7/1993 | Ketcham | 310/366 |
| 5,232,571 | 8/1993 | Braymen | 204/192.22 |
| 5,233,259 | 8/1993 | Krishnaswamy et al. | 310/324 |
| 5,283,458 | 2/1994 | Stokes et al. | 257/416 |
| 5,291,159 | 3/1994 | Vale | 333/188 |
| 5,294,898 | 3/1994 | Dworsky et al. | 333/187 |
| 5,334,960 | 8/1994 | Penunuri | 333/193 |
| 5,348,617 | 9/1994 | Braymen | 156/644 |
| 5,367,308 | 11/1994 | Weber | 343/700 |
| 5,369,053 | 11/1994 | Fang | 437/194 |
| 5,373,268 | 12/1994 | Dworsky et al. | 333/187 |
| 5,381,385 | 1/1995 | Greenstein | 367/140 |
| 5,403,701 | 4/1995 | Lum et al. | 430/315 |
| 5,404,628 | 4/1995 | Ketcham | 29/25.35 |
| 5,438,554 | 8/1995 | Seyed-Bolorforosh et al. | 367/140 |
| 5,446,306 | 8/1995 | Stokes et al. | 257/416 |
| 5,552,655 | 9/1996 | Stokes et al. | 310/330 |
| 5,587,620 | 12/1996 | Ruby et al. | 310/346 |
| 5,596,239 | 1/1997 | Dydyk | 310/311 |
| 5,597,444 | 1/1997 | Gilton | 156/643.1 |
| 5,617,065 | 4/1997 | Dydyk | 333/186 |
| 5,630,949 | 5/1997 | Lakin | 216/61 |
| 5,646,583 | 7/1997 | Seabury et al. | 333/187 |
| 5,692,279 | 12/1997 | Mang et al. | 29/25.35 |

(List continued on next page.)

OTHER PUBLICATIONS

Suto, S., et al.; Highly Selective Etching of $Si_3N_4$ to $SiO_2$ Employing Fluorine and Chlorine Atoms Generated by Microwave Discharge; 1989, J. Electrochem. Soc. vol. 136, pp. 2032–2034.

Sparks, Douglas R, Plasma Etching of Si, $SiO_2$, $Si_3N_4$, and Resist with Fluorine, Chlorine, and Bromine Compounds, 1992, J. Electrochem. Soc. vol. 139, pp. 1736–1741.

Rossnagel, S.M., Sputter deposition for semiconductor manufacturing, 1999, IBM J. Res. Develop, vol. 43, pp. 163–179.

Primary Examiner—Frankie L. Stinson
Assistant Examiner—Shamim Ahmed
(74) Attorney, Agent, or Firm—Brown & Michaels, PC

(57) ABSTRACT

The invention removes a portion(s) of a material of interest, while leaving an adjacent or underlying electrode(s) intact. The material is exposed to a plasma containing at least two-halogen-containing gases. At least a portion of the material, for example a piezoelectric material, an oxygen-containing material, or a nitrogen-containing material, is etched by the plasma. By removing desired portions of this material, the device can have alternative or complex architecture. In addition, the propagation of shear waves is limited in the device.

29 Claims, 3 Drawing Sheets

U.S. PATENT DOCUMENTS

| | | | |
|---|---|---|---|
| 5,698,928 | 12/1997 | Mang et al. | 310/322 |
| 5,702,775 | 12/1997 | Anderson et al. | 428/1 |
| 5,707,901 | 1/1998 | Cho et al. | 438/595 |
| 5,714,917 | 2/1998 | Ella | 332/144 |
| 5,741,742 * | 4/1998 | Kamide | 438/653 |
| 5,760,663 | 6/1998 | Pradal | 333/187 |
| 5,780,713 | 7/1998 | Ruby | 73/1.82 |
| 5,789,845 | 8/1998 | Wadaka et al. | 310/334 |
| 5,801,476 | 9/1998 | Sturzebecher et al. | 310/324 |
| 5,821,170 | 10/1998 | Klingbeil et al. | 438/745 |
| 5,821,833 | 10/1998 | Lakin | 333/187 |
| 5,830,774 | 11/1998 | Klingbeil et al. | 437/203 |
| 5,853,601 | 12/1998 | Krishaswamy et al. | 216/2 |
| 5,858,086 | 1/1999 | Hunter | 117/84 |
| 5,864,261 | 6/1999 | Weber | 333/187 |
| 5,872,493 | 2/1999 | Ella | 333/191 |
| 5,873,153 | 2/1999 | Ruby et al. | 29/25.35 |
| 5,873,154 | 2/1999 | Ylilammi et al. | 29/25.35 |
| 5,883,575 | 3/1999 | Ruby et al. | 340/572.5 |
| 5,884,378 | 3/1999 | Dydyk | 29/25.35 |
| 5,894,647 | 4/1999 | Lakin | 29/25.35 |
| 5,900,163 | 5/1999 | Yi | 216/79 |
| 5,906,950 | 5/1999 | Keller | 438/719 |
| 5,910,756 | 6/1999 | Ella | 333/133 |
| 5,928,598 | 7/1999 | Anderson et al. | 264/446 |
| 5,942,958 | 8/1999 | Lakin | 333/189 |
| 5,963,856 | 10/1999 | Kim | 455/307 |
| 6,051,907 | 4/2000 | Ylilammi | 310/312 |
| 6,060,818 | 5/2000 | Ruby et al. | 310/363 |
| 6,081,171 | 6/2000 | Ella | 333/189 |
| 6,087,198 | 7/2000 | Panasik | 438/51 |
| 6,127,768 | 10/2000 | Stoner et al. | 310/313 A |
| 6,150,703 | 11/2000 | Cushman et al. | 257/415 |
| 6,198,208 | 3/2001 | Yano et al. | 310/358 |
| 6,204,737 | 3/2001 | Ella | 333/187 |
| 6,215,375 | 4/2001 | Larson, III et al. | 333/187 |

* cited by examiner

SELECTIVE ETCHING OF THIN FILMS

REFERENCE TO RELATED APPLICATIONS

This application is related to a copending application entitled "Method of Isolation for Acoustic Resonator Devices" filed on the same day. The aforementioned application is hereby incorporated herein by reference.

FIELD OF THE INVENTION

The invention pertains to the field of electronic device fabrication. More particularly, the invention pertains to methods of etching thin films, and products made by such methods.

BACKGROUND OF THE INVENTION

Thin film resonators (TFRs) are thin film acoustic devices which can resonate in the radio frequency to microwave range, for example, 0.5 to 5 Gigahertz (GHz), in response to an electrical signal. A typical TFR contains a piezoelectric film between a first electrode and a second electrode which supports the electric field across the piezoelectric film when a signal is applied to the device. The piezoelectric film is made of a piezoelectric crystalline material, such as zinc oxide, aluminum nitride (AlN) and other piezoelectric crystalline material, which exhibits a piezoelectric effect. The piezoelectric effect occurs when the piezoelectric material induces a strain in response to an electric field applied across the piezoelectric material, or produces an electric field in response to mechanical stress applied to the piezoelectric material. If the electric field across the piezoelectric film is an alternating electric field having frequency components corresponding to resonant frequencies of the piezoelectric film, the film vibrates at the resonant frequencies (e.g. a fundamental frequency and harmonics), the fundamental frequency of which is approximately defined for a film of uniform thickness as the acoustic velocity (v) in the film divided by two (2) times the thickness (t) of the film or $f_r = v/2t$. The film mechanically vibrates at the resonant frequencies which in turn produces an alternating electric field at the resonant frequencies.

The physical size of a resonant structure in an electrical circuit is dictated by its operational frequency. For example, the length (L) of a side of a resonant cube is given by $L=\lambda/2=v/f$, where $\lambda$ is the wavelength for the wave of frequency f, and v is the wave's velocity in a particular medium. In the microwave region, these wavelengths are on the order of a millimeter, and it is in this region of the electromagnetic spectrum where application of resonant cavities to electrical circuits becomes practical. However, on the scale of today's microelectronics, a single device of millimeter dimensions is comparatively large.

In electronic circuit applications, such materials can be used to form resonant structures, that is, structures which affect a circuit's impedance as a function of a signal's frequency. For example, when embodied as an electrical filter, such a resonant structure will offer low impedance to a desired range of frequencies (the pass band) and high impedance to frequencies outside that range (the stop band). In this way, the device selects the frequencies which pass through the circuit and ideally rejects all others.

Use of piezoelectric materials in the fabrication of microwave resonators offers a potential for tremendous size reduction. The action of a piezoelectric is such that it converts a wave traveling at the speed of light to one traveling at the speed of sound, and vice versa. In most media, the velocity (v) of sound is $1/10,000^{th}$ that of light. Thus, referring to the above expression, the wavelength ($\lambda$)—and therefore the device dimension—is reduced accordingly.

However, due to the imperfections in the piezoelectric material (polycrystalline structure, grain boundaries, etc.) of the device, waves are also launched parallel to the surface (perpendicular to the bulk mode), producing lateral, or shear, acoustic waves in addition to the acoustic waves propagating perpendicularly. These lateral waves lower the efficiency of these devices. The extra piezoelectric material not directly between the electrodes allows propagation of these shear waves.

Therefore, a method for etching the superfluous portions of a material that permits patterned removal of the material without affecting a surface immediately below it is desired.

SUMMARY OF THE INVENTION

The invention involves removing a portion(s) of a material of interest, while leaving an adjacent or underlying electrode(s), for example an aluminum electrode, intact. For example, a plasma containing at least two halogen-containing gases is used to etch the exposed portion(s) of the material layer such as a piezoelectric layer of aluminum nitride (AlN) adjacent to at least one electrode layer, such as an aluminum electrode layer. While each halogen-containing gas used independently will etch the piezoelectric layer, the combination of two or more halogen-containing gases enables a useful etch rate and a stable plasma. Removal of at least one of the halogen-containing gases near the end of the etch cycle completes the etch while preserving an adjacent electrode. Using this method, the superfluous portion(s) of the piezoelectric material is removed without affecting the electrode.

DETAILED DESCRIPTION

Figure 1:
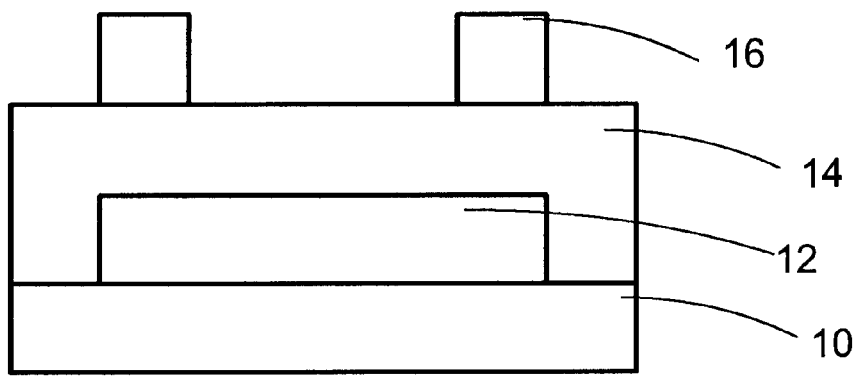
FIG. 1 shows a schematic illustration of a semiconductor device containing a substrate, a base electrode layer, a material layer, and an upper electrode layer as known in the prior art.

The present invention addresses the problem of removing portions of a thin film layer, while leaving the underlying layers intact. This problem can be solved by selective gas-phase removal of the exposed portion of a relatively inert thin film while preserving an underlying thin film. "Exposed portion" is defined as the part of the thin film layer which is not covered by either another device layer, a masking layer, or both. Instead, they are unprotected and in direct contact with the plasma in the etching process.

By selectively etching the portions of the film which are exposed and not masked by adjacent layers, superfluous portions of the thin film not needed for device operation can be removed from the device. This removal leads to improved device operation by limiting the propagation of shear waves. Alternatively, the method may be used to integrate devices or to create complex or varying architecture within a device.

An example of a device in which this invention would be particularly useful is in the fabrication of a thin film resonator (TFR). As with other materials employed by the electronic device industry, it is desirable to pattern a piezoelectric layer such as aluminum nitride or zinc oxide with high resolution. Successfully performing this step enables both enhanced acoustic device performance and novel device architectures.

Reactive ion etching (RIE) has the potential for high resolution patterning of piezoelectrics, or any material adjacent to an electrode, including nitrogen-containing layers and oxygen-containing layers. RIE is one of a number of industry-standard pattern transfer tools. To create the desired pattern, a mask of etch-resistant material is first formed on the substrate. To enable pattern transfer via RIE, the masked substrate is then placed in a high-vacuum chamber between parallel-plate electrodes. A reactive gas is next introduced into the chamber and an electric potential is applied between the electrodes. This potential is of sufficient magnitude to ionize the reactive gas, producing electrically charged radicals which are both chemically reactive and subject to acceleration induced by the applied electric field. Choice of the reactive gas depends on the properties of the layer to be etched, the desired etching profile, the etching selectivity with respect to another layer in the structure, and compatibility with other gases in the process.

The electrically charged gaseous environment mentioned above is generically known as a "plasma". In the plasma state, the positively charged ions are accelerated toward the negatively charged cathode upon which the substrate rests. The ions react with unmasked substrate material to form a volatile product which is pumped away by the vacuum system.

However, the relatively inert chemical nature of the piezoelectric material complicates the ability to selectively etch this material while preserving adjacent electrodes. Specifically, any conducting electrodes lying beneath the piezoelectric material need to be undamaged by the etching process of the piezoelectric material.

In accordance with an embodiment of the invention, the general process consists of using a gas mixture which aggressively reacts with the subject (inert) film as well as an adjacent electrode. At some point during the etching process at least one component of this gas mixture is removed or changed, resulting in a less-aggressive etchant which, upon complete removal of the target film, leaves the adjacent electrode intact.

Referring to FIG. 1, the prior art shows the starting material for the method of the present invention. A substrate (10) is covered by a film consisting of a base electrode layer (12), a material layer (14), and an upper electrode layer (16). The material layer (14) is preferably composed of a piezoelectric material such as zinc oxide or aluminum nitride, an oxygen-containing material, or a nitrogen-containing material. The electrode layers (12) and (16) are preferably metallic. The material layer (14) conforms to the underlying topology of base electrode layer (12) and is not necessarily planar as schematically shown in FIGS. 1–4. Both of the electrode layers (12) and (16) preferably have a sheet resistance less or equal to 100 ohms/square. Either or both of the electrode layers (12) and (16) in the starting material may be patterned.

Figure 2:
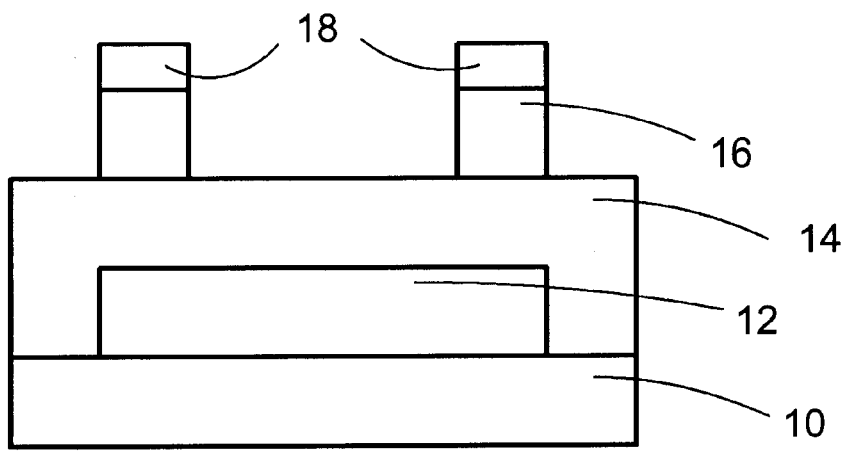
FIG. 2 shows a schematic illustration of the semiconductor device of FIG. 1 with the addition of a masking layer which has been patterned with photoresist.
Figure 3:
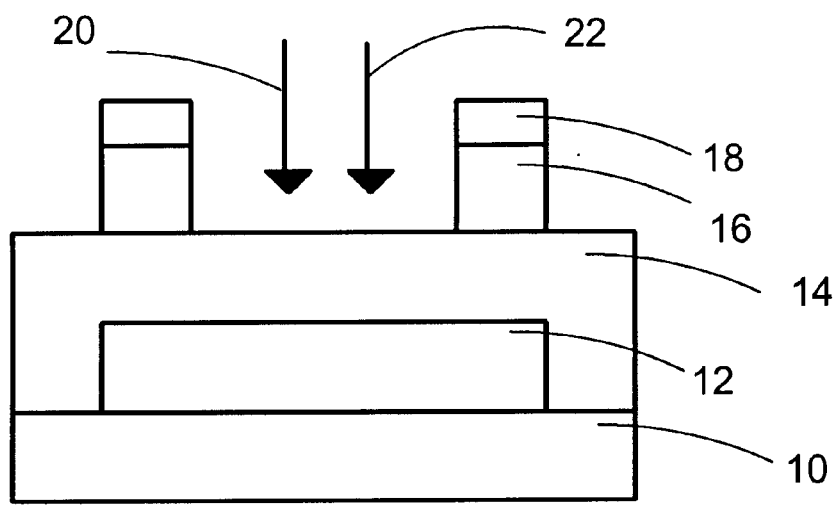
FIG. 3 shows a schematic illustration of the semiconductor device of FIG. 1, during the etching process of the current invention where an RIE plasma includes two halogen-containing gases.
Figure 4:
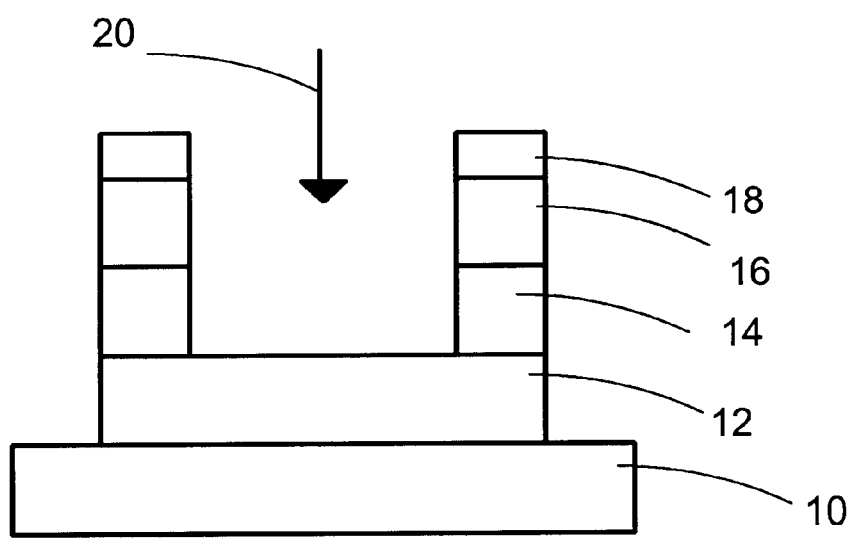
FIG. 4 shows a schematic illustration of the semiconductor device of FIG. 1, during the etching process of the current invention when one of the halogen-containing gases is removed from the plasma, thus leaving only one halogen-containing gas.

Referring to FIGS. 2 through 4, a schematic illustration of a semiconductor device during the fabrication process is shown. These figures are simplified schematic representations of the semiconductor device, and are not intended to limit the scope of the invention. Although two electrode layers (12) and (16) are shown in this example, only one electrode layer adjacent to the material layer (14) is needed to practice the invention. A layer, which is preferably continuous, is initially added to completely coat the upper electrode layer (16) and the exposed areas of the material layer (14). The layer is patterned by applying photoresist in the same pattern as that of the upper electrode layer (16), and then etching away the layer except where it overlies the upper electrode layer (16), forming the masking layer (18). The masking layer (18), now patterned, provides the etch-resistant mask which allows a pattern to be etched onto the material layer (14).

Referring to FIG. 3, a plasma containing two halogen-containing gases (20) and (22), each of which contains a halogen of a different molecular weight, is applied to the device. Optionally, additional gases may be a part of the plasma to improve the etch rate. The two halogen-containing gases (20) and (22) are chosen so that, in conduction, they effectively etch the exposed portion of the material layer (14).

The exposed portion of the material layer (14) is aggressively etched in the plasma containing the two halogen-containing gases (20) and (22). Efficient removal of the material layer (14) may be monitored by in-situ or ex-situ techniques including laser interferometery and RGA (residual gas analysis).

When substantially all of the exposed portion of the material layer (14) has been etched, one of the halogen-containing gases (22) is removed from the plasma. After removing this halogen-containing gas (22), the diluted plasma continues to etch the material layer (14). Referring to FIG. 4, the exposed portion(s) of the material layer (14) is etched to completion, leaving a defined pattern. However, the plasma has a substantially negligible effect on removal of the base electrode layer (12), and the etch stops when the plasma reaches the base electrode layer (12). Although all of the exposed portion(s) of the material layer (14) is removed in FIG. 4, etching only desired portions of the material layer (14) is also an object of the invention.

As a specific example, the present invention provides an etch process which solves the problem of selectively etching a piezoelectric layer such as an aluminum nitride layer while keeping an aluminum electrode underlayer intact. This embodiment involves the patterning of an aluminum nitride layer in a plasma containing both chlorine-containing gases and a fluorine-containing gas.

Referring back to FIG. 1 a substrate (10) is covered by a film consisting of a base aluminum electrode layer (12), an aluminum nitride layer (14), and an upper aluminum electrode layer (16). The aluminum nitride layer (14) conforms to the underlying topology of base aluminum electrode layer (12) and is not necessarily planar as schematically shown in FIGS. 1–4. The substrate (10) is broadly defined as a surface upon which the two aluminum electrode layers (12) and (16) and the aluminum nitride layer (14) are deposited.

Silicon wafers are a preferred substrate (10) for use in this example of the method. The silicon substrate (10) is not integral to device operation; it predominantly provides mechanical support. The silicon wafers are roughly 0.6 mm thick and about 200 mm in diameter. Perhaps thousands of devices are built on a single wafer. After some preparation, a 100 nanometer film of metal, for example aluminum, is deposited on the wafer surface. The deposition is carried out in a vacuum chamber via a physical vapor deposition or analogous process. A continuous conducting layer results.

To pattern the aluminum, a lithographic process in which a thin layer of a photosensitive material is applied to completely coat the aluminum film is employed to pattern the aluminum layer. Exposure through a mask and immersion in a developer removes any photoresist exposed to light. Subsequent immersion in an aluminum etchant removes the uncovered aluminum but leaves behind the material protected by the remaining photoresist. When the remaining photoresist is removed in a solvent, an island of aluminum forms the base aluminum electrode layer (12) of the device. Although a patterned base aluminum electrode layer (12) is shown in FIGS. 1–4, it is not necessary to pattern the base aluminum electrode layer (12) or to pattern this aluminum electrode layer (12) with the above method in order to practice the method of the present invention. The decision to pattern the base aluminum electrode layer (12) depends on the type of device being fabricated.

At this stage, the sample is returned to a vacuum chamber for the deposition of aluminum nitride, a piezoelectric material used in resonators. Just as with the aluminum, the aluminum nitride layer (14) is deposited everywhere over the substrate, but the aluminum nitride layer (14) is left unpatterned, and is subsequently preferably coated with another film of aluminum metal. This second metal film is patterned and etched with the lithographic process described above, creating an upper aluminum electrode layer (16).

Figure 5:
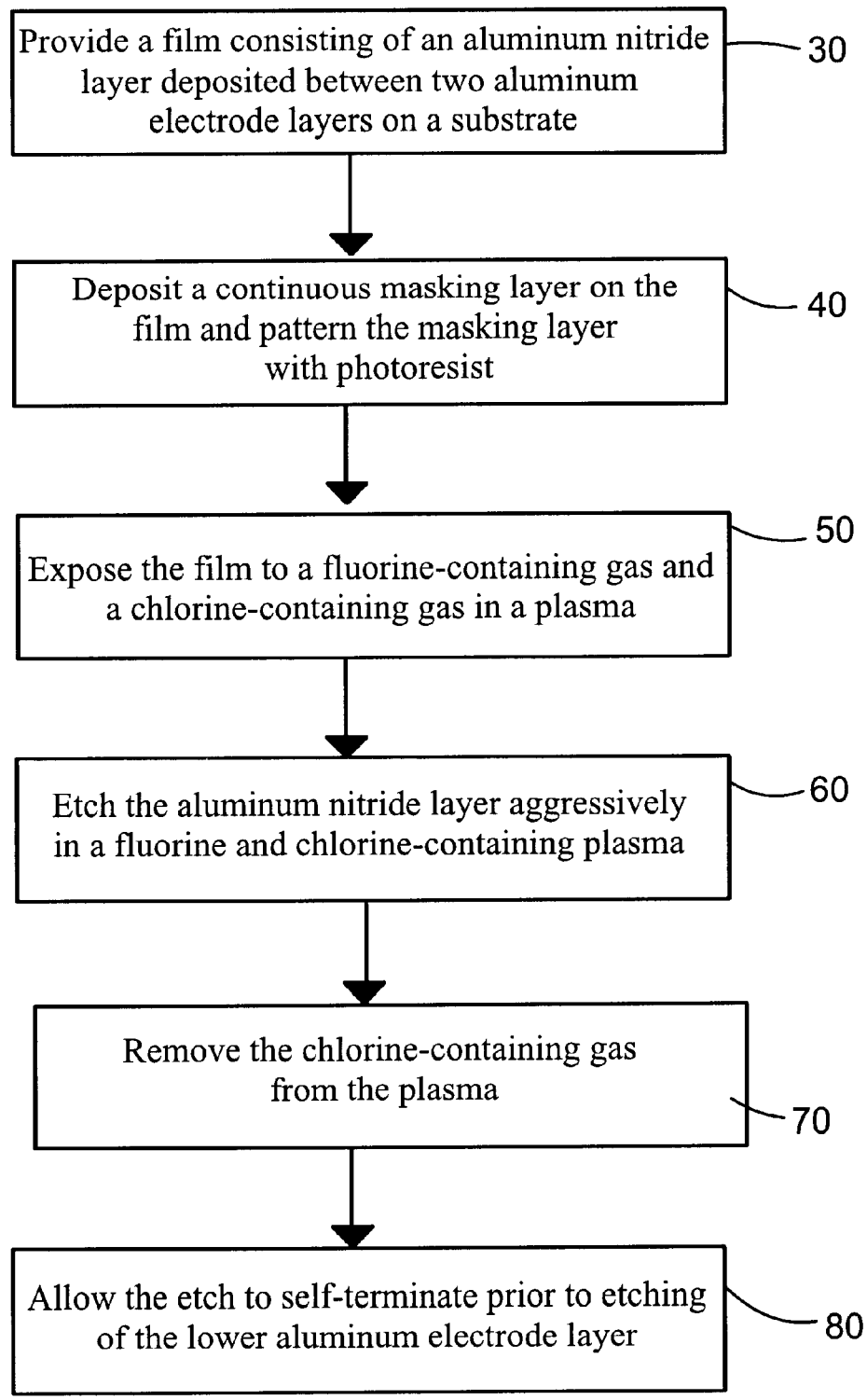
FIG. 5 shows a flowchart of an example of the method of the current invention.

At this point, unlike the two aluminum electrode layers (12) and (16), the aluminum nitride layer (14) is continuous (unpatterned). Because the aluminum nitride layer (14) completely covers aluminum layer (12), there is no direct electrical connection between the two aluminum electrode layers (12) and (16). The film essentially as described above is provided in step (30) of the present method, as detailed in the flowchart of FIG. 5.

A continuous layer, preferably composed of $SiO_X$, is initially added to completely coat the upper aluminum electrode layer (16) and the exposed areas of the aluminum nitride layer (14). The continuous layer is patterned in step (40) by applying photoresist in the same pattern as that of the upper aluminum electrode layer (16), and then etching away the continuous layer except where it overlies the upper electrode layer (16), forming the masking layer (18) shown in FIG. 2. The masking layer (18), now patterned, provides the etch-resistant mask which allows a pattern to be etched onto the aluminum nitride layer (14).

Referring to FIG. 3, in step (50) the aluminum nitride layer (14) is exposed to a plasma containing at least one fluorine-containing gas (20) and at least one chlorine-containing gas (22). As an example, $CHF_3$ is the fluorine-containing gas (20), while a combination of $Cl_2$ and $BCl_3$ comprise the chlorine-containing gas (22). In this example, Ar is preferably included in the plasma.

The preferable flow rates for $Cl_2$, $BCl_3$, $CHF_3$ and Ar are 30, 40, 5, and 15 sccm, respectively. These flow rates correspond to relative percentages of 33%, 44%, 6%, and 17% for $Cl_2$, $BCl_3$, $CHF_3$ and Ar, respectively.

The etching of aluminum-containing compounds in chlorine is expected. However, when used alone, a $Cl_2$ plasma is unstable, often leaves an inert residue on the aluminum nitride surface, and is very aggressive on both the masking material and the aluminum electrode. The addition of $CHF_3$ to the plasma helps to both stabilize the plasma and limit the formation of the residue. Ar helps remove the residue that is deposited despite the presence of fluorine. The addition of $BCl_3$ enhances the anisotropy of the etch profile.

The combination of the fluorine-containing gas (20) and the chlorine-containing gas (22) in the plasma is quite aggressive in its attack on both the aluminum nitride layer (14) and the base aluminum electrode layer (12) in these devices. Therefore, the aggressive nature of the fluorine-containing gas (20) and the chlorine-containing gas (22) together in the plasma is used to remove the aluminum nitride overlying the base aluminum electrode layer (12), except where it is overlaid by the upper electrode layer (16) and masking layer (18).

The exposed portion of the aluminum nitride layer (14) is aggressively etched by the plasma of the fluorine-containing gas (20) and the chlorine-containing gas (22) in step (60). Utilizing the gas composition of $Cl_2$, $BCl_3$, $CHF_3$ and Ar, aluminum nitride etches at about 100 nm per minute. There are laser-based etch monitors available which aid in determining how much of the aluminum nitride layer has been etched. The end of the aluminum nitride etch is determined by timing or interferometry.

The chlorine-containing gas (22) must be removed before the etch breaks through the aluminum nitride and attacks the underlying base aluminum electrode layer (12). Because the aluminum film, for example, is relatively thin and the $Cl_2$ is so aggressive, if the $Cl_2$ is able to penetrate to the base aluminum electrode layer (12), the etch would quickly destroy the base aluminum electrode layer (12), thus fatally compromising the electronic device.

The chlorine-containing gas (22) is removed from the plasma in step (70). In the example where $Cl_2$, $BCl_3$, $CHF_3$ and Ar make up the initial plasma, $Cl_2$, $BCl_3$, and Ar are all removed from the plasma. Although Ar is not involved in the chemistry which aggressively etches the aluminum, if it is left in the plasma, it physically erodes the base aluminum electrode layer (12).

After etching the exposed portion of the aluminum nitride layer, the chlorine-containing gas (22) is turned off, and the aluminum nitride continues etching, albeit much more slowly, in the fluorine-containing gas (20). However, because the fluorine compound etches the aluminum nitride at about $\frac{1}{10}$ the rate of the chlorine and fluorine combination, as much of the aluminum nitride as possible is removed with the more aggressive chemistry.

Referring to FIG. 4, the exposed portion of the aluminum nitride layer (14) is etched to completion, leaving a defined pattern. At this point, the plasma contains only the fluorine-containing gas (20). In the example, this gas is $CHF_3$. $SF_6$ is preferably added during step (80) to increase the fluorine content of the plasma. In addition, $O_2$ is preferably added to the plasma, thereby liberating more fluorine from both $CHF_3$ and $SF_6$. Utilizing a combination of $CHF_3$, $SF_6$, and $O_2$, these gases are preferably released into the plasma at flow rates of 40, 40, and 5 sccm, respectively. Alternatively, $SF_6$ and $CHF_3$ are used in equal parts without the addition of $O_2$.

The fluorine-containing gas (20) tends to have a very limited etch rate on an aluminum film. The inability of fluorine gases to effectively etch aluminum is attributed to the formation of an $AlF_X$ compound at the surface of the aluminum which does not etch in fluorine. Due to the inability of fluorine to effectively etch aluminum, the aluminum nitride-etching process self-terminates in step (80) at the aluminum electrode surface. The base aluminum electrode layer (12) is thus preserved while the aluminum nitride layer (14) is completely removed at the patterned site.

The device shown in FIG. 4 has a signal path well confined to the resonator regions of the device, as the medium that would support lateral wave motion between the two electrodes has been eliminated. Selective etching of aluminum nitride removes superfluous material that supports shear wave propagation. By masking the top electrodes and etching the exposed aluminum nitride, but stopping the etch at the surface of the lower aluminum electrode, the electrical connection between the two electrodes is maintained. This enables enhanced device performance.

The method is also applicable to patterning and etching the upper aluminum electrode layer (16) and the aluminum nitride layer (14) concurrently. In this embodiment of the invention, a continuous upper aluminum electrode layer (16) is masked by a specific pattern. A reactive ion etching process is performed which includes chlorine-containing gases, for example $BCl_3$ and $Cl_2$, in the initial plasma. Once the etch reaches the aluminum nitride layer (14), a fluorine containing gas, for example, $CHF_3$, and any other gases which aid in the etch process, for example Ar, are added to the plasma The aluminum nitride etch then proceeds as described above.

The description of the invention is not intended to limit the scope of the claims. For example, although the device which has been described is preferably a thin film resonator with two resonators, the invention is also applicable in a situation where one, or more than two resonators are a part of the device. In addition, various architectures are covered by the scope of the invention.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A method of removing a portion of a material layer comprising the steps of:
    a) providing a first electrode layer and a material layer adjacent to said first electrode layer;
    b) exposing a portion of said material layer to a plasma comprising at least two halogen-containing gases differing by at least their halogen content such that the combination of said halogen-containing gases effectively etches said portion of said material layer; and
    c) removing at least one of the halogen-containing gases from said plasma such that the resultant plasma has a substantially negligible etch rate on said first electrode layer.

2. The method of claim 1 further comprising providing a second electrode layer adjacent to said material layer.

3. The method of claim 2 wherein said second electrode layer is patterned.

4. The method of claim 2 wherein said second electrode layer has a sheet resistance less or equal to 100 ohms/square.

5. The method of claim 2 wherein said second electrode layer is a metallic electrode layer.

6. The method of claim 1 further comprising the steps, prior to step (b), of:

depositing a continuous layer on said material layer; and
    patterning said continuous layer by removing at least a portion of the continuous layer and leaving a masking layer overlying at least a portion of said material layer.

7. The method of claim 1 wherein said first electrode layer is patterned.

8. The method of claim 1, in which, in step (c) at least one halogen-containing gas is removed at a point before the plasma begins to etch said first electrode layer.

9. The method of claim 1 wherein removal of at least one halogen-containing gas from said plasma occurs after substantially all of the portion of said material layer is etched.

10. The method of claim 1 wherein said first electrode layer has a sheet resistance less or equal to 100 ohms/square.

11. The method of claim 1 wherein removal of the material layer is monitored in-situ.

12. The method of claim 1 wherein removal of the material layer is monitored ex-situ.

13. The method of claim 1 wherein removal of the material layer is monitored by a process selected from the group consisting of laser interferometry and residual gas analysis.

14. The method of claim 1 wherein said first electrode layer is a metallic electrode layer.

15. The method of claim 14 wherein said first electrode layer comprises an aluminum electrode layer.

16. The method of claim 15 wherein said material layer is an aluminum nitride layer.

17. The method of claim 16 wherein said halogen-containing gases in step (b) comprise at least one fluorine-containing gas and at least one chlorine-containing gas.

18. The method of claim 17 wherein the fluorine-containing gas is $CHF_3$.

19. The method of claim 17 wherein the chlorine-containing gas is a combination of $BCl_3$ and $Cl_2$.

20. The method of claim 17 wherein said plasma in step (b) comprises a mixture of $BCl_3$, $Cl_2$, $CHF_3$ and Ar.

21. The method of claim 17 wherein the halogen-containing gas removed in step (c) comprises at least one chlorine-containing gas.

22. The method of claim 21 wherein, after removal of the chlorine-containing gas in step (c), said plasma comprises $CHF_3$.

23. The method of claim 21, further comprising the step, after step (c), of adding $SF_6$ to the plasma.

24. The method of claim 21, further comprising the step, after step (c), of adding $O_2$ to the plasma.

25. The method of claim 21 wherein, after removal of said at least one chlorine-containing gas in step (c), said plasma comprises $CHF_3$ and $SF_6$.

26. The method of claim 21 wherein, after removal of said at least one chlorine-containing gas in step (c), said plasma comprises $CHF_3$, $SF_6$, and $O_2$.

27. The method of claim 1 wherein said material layer is an oxygen-containing layer.

28. The method of claim 1 wherein said material layer is a nitrogen-containing layer.

29. The method of claim 1 wherein said material layer is a piezoelectric layer.

* * * * *